United States Patent
Regensburger

(10) Patent No.: US 11,391,427 B2
(45) Date of Patent: Jul. 19, 2022

(54) LIGHTING DEVICE INCLUDING PIXELATED LIGHT-EMITTING SEMICONDUCTOR CHIP, AND METHOD OF MAKING SAME

(71) Applicant: OSRAM Opto Semiconductors GmbH, Regensburg (DE)

(72) Inventor: Robert Regensburger, Kallmünz (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/414,256

(22) PCT Filed: Dec. 10, 2019

(86) PCT No.: PCT/EP2019/084397
§ 371 (c)(1),
(2) Date: Jun. 15, 2021

(87) PCT Pub. No.: WO2020/126664
PCT Pub. Date: Jun. 25, 2020

(65) Prior Publication Data
US 2022/0057062 A1    Feb. 24, 2022

(30) Foreign Application Priority Data

Dec. 18, 2018    (DE) .................... 10 2018 132 691.2

(51) Int. Cl.
*F21S 41/153*    (2018.01)
*H01L 25/075*    (2006.01)
(Continued)

(52) U.S. Cl.
CPC ........ *F21S 41/153* (2018.01); *H01L 25/0753* (2013.01); *H01L 27/156* (2013.01); *F21Y 2115/10* (2016.08)

(58) Field of Classification Search
CPC .. F21S 41/153; H01L 25/0753; H01L 27/156; F21Y 2115/10
See application file for complete search history.

(56) References Cited

U.S. PATENT DOCUMENTS 9,560,722 B2    1/2017 Yue et al.
10,005,384 B2    6/2018 Canonne et al.
(Continued)

FOREIGN PATENT DOCUMENTS

DE    202004012322 U1    10/2004
DE    102016100351 A1    7/2017
(Continued)

OTHER PUBLICATIONS

International Search Report for International Patent Application No. PCT/EP2019/084397, dated Feb. 17, 2020 (7 pages).

*Primary Examiner* — Tracie Y Green
(74) *Attorney, Agent, or Firm* — Arentfox Schiff LLP

(57) ABSTRACT

The invention relates to a lighting device comprising a pixelated light emitting semiconductor chip (pixelated with pixels), an electronic semiconductor chip for actuating the pixelated light emitting semiconductor chip, and a substrate. The pixelated light emitting semiconductor chip and the electronic semiconductor chip are placed next to one another on the substrate. The invention further relates to a process for manufacturing a lighting device.

17 Claims, 10 Drawing Sheets

(51) Int. Cl.
*H01L 27/15* (2006.01)
*F21Y 115/10* (2016.01)

(56) References Cited

U.S. PATENT DOCUMENTS

| | | | |
|---|---|---|---|
| 2014/0306248 A1* | 10/2014 | Ahn | H01L 33/62 257/88 |
| 2016/0161098 A1 | 6/2016 | Tudorica et al. | |
| 2018/0187839 A1 | 7/2018 | Vampola | |
| 2019/0215502 A1* | 7/2019 | Thin | H01L 33/24 |

FOREIGN PATENT DOCUMENTS

| | | |
|---|---|---|
| DE | 102016103552 A1 | 8/2017 |
| DE | 102017123402 A1 | 4/2019 |
| EP | 1418624 A2 | 5/2004 |
| FR | 3055946 A1 | 7/2020 |
| WO | 2019126540 A1 | 6/2019 |

* cited by examiner

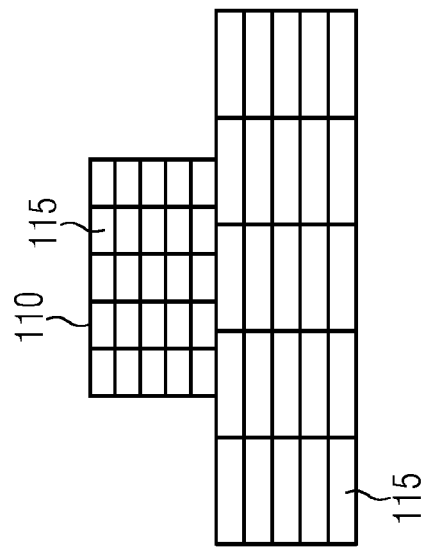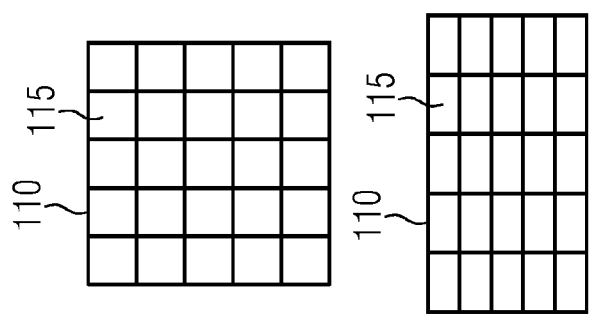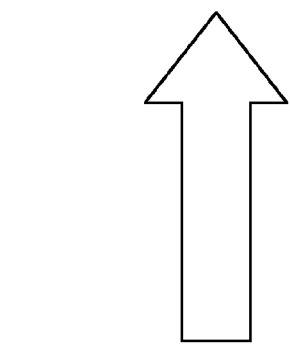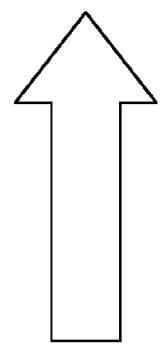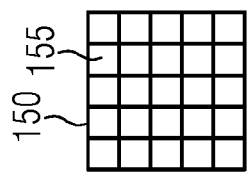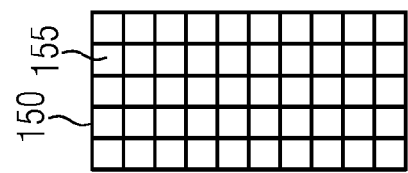
FIG 11
FIG 12

LIGHTING DEVICE INCLUDING PIXELATED LIGHT-EMITTING SEMICONDUCTOR CHIP, AND METHOD OF MAKING SAME

This application is a 35 U.S.C. § 371 National Phase of PCT Application No. PCT/EP2019/084397, filed on Dec. 10, 2019, which claims priority to German Patent Application No. 10 2018 132 691.2, filed Dec. 18, 2018, the disclosures of each of which are hereby incorporated by reference in their entireties.

The present invention relates to a lighting device, comprising a pixelated light-emitting semiconductor chip and an electronic semiconductor chip. The invention furthermore relates to a method for producing a lighting device.

This patent application claims the priority of German patent application 10 2018 132 691.2, the disclosure content of which is hereby incorporated by reference.

A pixelated lighting device that may be employed for example in the automotive field in a headlight of an adaptive lighting system (AFS, adaptive front-lighting system) may be realized in various ways. In one known configuration, individual light-emitting components or LEDs (light-emitting diode) arranged in a matrixlike manner are used. The light-emitting components may be driven by individual drivers or drivers for groups of light-emitting components.

In another configuration, a pixelated light-emitting semiconductor chip is used (µAFS, micro-structured adaptive front-lighting system). For driving purposes, an electronic semiconductor chip comprising a corresponding driver for each pixel of the light-emitting semiconductor chip is used. The light-emitting semiconductor chip is located directly on the electronic semiconductor chip, and is bonded on the latter by means of soldering, for example. Owing to this construction, in terms of the lateral dimensions the dimensioning of the electronic semiconductor chip is of exactly the same magnitude as that of the light-emitting semiconductor chip.

The object of the present invention is to specify a solution for an improved pixelated lighting device.

This object is achieved by means of the features of the independent patent claims. Further advantageous embodiments of the invention are specified in the dependent claims.

In accordance with one aspect of the invention, a lighting device is proposed. The lighting device comprises a pixelated light-emitting semiconductor chip, an electronic semiconductor chip for driving the pixelated light-emitting semiconductor chip, and a carrier. The pixelated light-emitting semiconductor chip and the electronic semiconductor chip are arranged next to one another on the carrier.

The use of the carrier in the lighting device, on which carrier the pixelated light-emitting semiconductor chip and the electronic semiconductor chip are positioned next to one another, affords a number of advantages over the arrangement of semiconductor chips one above another (chip-on-chip design) as is employed in a conventional lighting device. The proposed construction makes it possible to design the semiconductor chips of the lighting device largely independently of one another. This holds true for example in respect of the geometric shape and the form factor of the semiconductor chips and of constituent parts of the semiconductor chips, and also with regard to numbers of constituent parts of the semiconductor chips. In this way the lighting device may be realized cost-effectively. Furthermore, a high flexibility and scalability with regard to production of the lighting device may be made possible. A further possible advantage is a spatial decoupling of the semiconductor chips. A reliable manner of operation and a long lifetime of the electronic semiconductor chip, and thus of the lighting device, may be achieved as a result.

Further possible details and embodiments which may be considered for the lighting device are described more specifically below.

In one embodiment, the pixelated light-emitting semiconductor chip and the electronic semiconductor chip are arranged next to one another on one side of the carrier. The carrier may comprise two opposite main sides, wherein the semiconductor chips may be located on one of the main sides of the carrier. The main sides may be sides of the carrier having the largest lateral extent. The carrier may comprise a planar shape.

The pixelated light-emitting semiconductor chip and the electronic semiconductor chip may furthermore be arranged directly on the carrier or on one side of the carrier. In this case, the semiconductor chips may be secured on the carrier using a connecting material. The connecting material may respectively adjoin the carrier and one of the semiconductor chips. The connecting material may be electrically conductive, and be for example a solder or an adhesive or an electrically conductive adhesive.

In a further embodiment, the pixelated light-emitting semiconductor chip and the electronic semiconductor chip are arranged on the carrier at a distance from one another. A reliable thermal decoupling of the semiconductor chips may be achieved as a result of the spatial distance. During operation of the lighting device, merely a low or negligible thermal loading of the electronic semiconductor chip on account of thermal energy generated by the light-emitting semiconductor chip may occur in this way. Furthermore, coupling of light radiation emitted by the light-emitting semiconductor chip into the electronic semiconductor chip may be suppressed. This is associated with a long lifetime and a reliable manner of operation of the electronic semiconductor chip with a small risk of disturbance. This is correspondingly applicable to the lighting device.

In a further embodiment, the pixelated light-emitting semiconductor chip comprises a plurality of light-emitting pixels. The pixels may be arranged next to one another in a matrixlike fashion in the form of rows and columns. Furthermore, the pixels may be drivable separately from one another. As a result, the pixels may be operated individually and independently of one another for the emission of light radiation. The light-emitting semiconductor chip may furthermore be realized in the form of a pixelated light-emitting diode or LED chip.

In a further embodiment, the pixelated light-emitting semiconductor chip comprises a semiconductor layer sequence or a semiconductor body having light-emitting regions arranged next to one another. The light-emitting regions may be configured for generating primary light radiation. The light-emitting semiconductor chip may furthermore comprise a conversion layer for radiation conversion, which is arranged on the semiconductor layer sequence or on the semiconductor body and by which the primary light radiation may be partly converted into secondary light radiation. Mixed radiation comprising the primary light radiation and the secondary light radiation may be emitted during operation. The primary light radiation and the secondary light radiation may be blue light radiation and yellow light radiation, such that overall white light radiation may be emitted.

The pixels of the light-emitting semiconductor chip may be formed in each case by a light-emitting region of the semiconductor layer sequence or of the semiconductor body and a region of the conversion layer through which radiation from the relevant light-emitting region passes during operation. The lateral geometric shape of the pixels may be predefined by the lateral geometric shape of the light-emitting regions.

In a further embodiment, the electronic semiconductor chip comprises a plurality of driver cells configured for electrically driving pixels of the light-emitting semiconductor chip. The driver cells may comprise circuit structures such as, for example, switches in the form of transistors.

The following embodiments may be considered in regard to independently designing the semiconductor chips of the lighting device.

In a further embodiment, the pixelated light-emitting semiconductor chip and the electronic semiconductor chip, as seen in a plan view of the semiconductor chips, comprise different shapes or chip shapes. Different contours of the semiconductor chips and/or different sizes of the semiconductor chips may be considered in this context. With regard to the first variant, the semiconductor chips may comprise different geometric shapes such as, for example, different polygon shapes or different quadrangular shapes. With regard to the second variant, the semiconductor chips may comprise different lateral dimensions or surface dimensions.

It is possible, for example, for the electronic semiconductor chip to be configured to be smaller than the pixelated light-emitting semiconductor chip in terms of the lateral dimensions. A cost saving may be achieved in this way. This holds true for example in comparison with a conventional chip-on-chip arrangement of a pixelated light-emitting semiconductor chip on an electronic semiconductor chip, in which the electronic semiconductor chip is equipped with unused free surfaces for size matching purposes.

Alternatively, the lighting device may also be realized in such a way that the electronic semiconductor chip is configured to be larger than the pixelated light-emitting semiconductor chip in terms of the lateral dimensions.

In a further embodiment, different shapes of pixels of the light-emitting semiconductor chip and of driver cells of the electronic semiconductor chip are present. This holds true as seen in a plan view of these constituent parts of the semiconductor chips. Different contours of pixels and driver cells and/or different sizes of pixels and driver cells may be present in this context. With regard to the first variant, pixels and driver cells may comprise different geometric shapes. With regard to the second variant, pixels and driver cells may comprise different lateral dimensions or surface dimensions.

It is possible, for example, for the driver cells of the electronic semiconductor chip to be configured to be smaller than the pixels of the light-emitting semiconductor chip in terms of the lateral dimensions. A cost saving may be achieved in this way.

Furthermore, there is the possibility, for example, of the driver cells of the electronic semiconductor chip comprising a rectangular shape in plan view, and of the pixels of the light-emitting semiconductor chip comprising a shape deviating therefrom, for example a rectangular shape with a different aspect ratio, a round shape, a letter shape, or a shape reproducing an image or a symbol.

It is also possible for the driver cells of the electronic semiconductor chip to comprise a uniform, for example rectangular, shape as seen in plan view, and for the light-emitting semiconductor chip to comprise pixels having different pixel shapes, i.e. different contour shapes and/or different lateral dimensions. One possible example is pixels having pixel shapes which are distorted and which deviate from a rectangular shape to different extents. Another example is pixels which are present in a plurality of different pixel shapes and/or pixel sizes.

In a further embodiment, the number of pixels of the light-emitting semiconductor chip deviates from the number of driver cells of the electronic semiconductor chip. A cost saving may be achieved in this way, too. It is possible, for example, for the number of driver cells of the electronic semiconductor chip to exceed the number of pixels of the light-emitting semiconductor chip. An opposite configuration is conceivable too, in which the number of driver cells of the electronic semiconductor chip is smaller than the number of pixels of the light-emitting semiconductor chip.

The carrier of the lighting device may be used not only for carrying or holding the semiconductor chips but also for providing an electrical connection between the semiconductor chips. In this context, in accordance with a further embodiment, provision is made for the carrier to comprise electrical conductor structures, by way of which the pixelated light-emitting semiconductor chip and the electronic semiconductor chip are electrically connected to one another. The electrically conductive conductor structures may be embodied at least partly in metallic fashion, and may comprise constituent parts such as, for example, contact elements, conductor tracks and/or vertical conductive connections or vias (vertical interconnect access).

Besides the electrical conductor structures, the carrier of the lighting device may furthermore comprise at least one carrier material. This may be for example an insulating material such as, for example, a ceramic material, silicon oxide, silicon nitride, polyimide or a semiconductor material such as silicon, for example. The use of a plurality of the aforementioned carrier materials is also possible. The conductor structures of the carrier may be embedded at least partly in the at least one carrier material.

In a further embodiment, the pixelated light-emitting semiconductor chip comprises a contact structure having contact elements on a side provided for mounting on the carrier. In this configuration, the light-emitting semiconductor chip may be realized in the form of a flip-chip. By way of the contact elements, the semiconductor chip may be contacted, and the pixels or light-emitting regions of the light-emitting semiconductor chip may be electrically driven separately from one another. The carrier of the lighting device may comprise contact elements coordinated therewith, which may be connected to the contact elements of the light-emitting semiconductor chip by way of an electrically conductive connecting material such as, for example, a solder or an electrically conductive adhesive. The contact elements of the carrier may be part of the electrical conductor structures thereof.

In a corresponding manner, the electronic semiconductor chip may comprise a contact structure having contact elements on a side provided for mounting on the carrier. The carrier may comprise contact elements coordinated therewith, which may be connected to the contact elements of the electronic semiconductor chip by way of an electrically conductive connecting material such as, for example, a solder or an electrically conductive adhesive. These contact elements of the carrier may also be part of the electrical conductor structures thereof.

In a further embodiment, driver cells of the electronic semiconductor chip are connected in parallel by way of electrical conductor structures of the carrier. This embodiment may be employed if the number of driver cells of the electronic semiconductor chip is greater than the number of pixels of the light-emitting semiconductor chip. Here, in each case a plurality of (for example two) driver cells of the electronic semiconductor chip may be used for driving one of the pixels of the light-emitting semiconductor chip. An increase (for example doubling) of the electric current that may be applied to driven pixels of the light-emitting semiconductor chip may be achieved as a result of the parallel connection of driver cells.

In a further embodiment, pixels of the light-emitting semiconductor chip are connected in parallel by way of electrical conductor structures of the carrier. This embodiment may be employed if the number of driver cells of the electronic semiconductor chip is less than the number of pixels of the light-emitting semiconductor chip. In each case a plurality of (for example two) pixels of the light-emitting semiconductor chip may be electrically driven by one of the driver cells of the electronic semiconductor chip as a result of the parallel connection of pixels.

In a further embodiment, the lighting device comprises at least one further carrier on which the carrier carrying the semiconductor chips is arranged. The at least one further carrier may be for example a printed circuit board (PCB), a metal core printed circuit board (MCPCB) or a metallic carrier. The at least one further carrier may be used for heat dissipation, inter alia.

In a further embodiment, the lighting device is a headlight or a constituent part of a headlight. The headlight may be used in an adaptive lighting system of a vehicle. Further components such as, for example, an optical unit for beam shaping may be employed in this context.

In accordance with a further aspect of the invention a method for producing a lighting device is proposed. The method comprises providing a pixelated light-emitting semiconductor chip, providing an electronic semiconductor chip configured for driving the pixelated light-emitting semiconductor chip, and providing a carrier. A further method step is arranging the pixelated light-emitting semiconductor chip and the electronic semiconductor chip next to one another on the carrier.

In the case of the lighting device produced with the aid of the method, the semiconductor chips may be spatially decoupled from one another. This enables a reliable manner of operation and a long lifetime of the lighting device. Furthermore, the semiconductor chips used in the method may be designed and provided largely independently of one another. In this way the lighting device may be produced cost-effectively, for example. Furthermore, a high flexibility and scalability with regard to the production of the lighting device may be made possible.

In regard to the last-mentioned point, a configuration of the electronic semiconductor chip may be employed, for example, which is suitable for driving different configurations of pixelated light-emitting semiconductor chips. In this way there is the possibility of realizing different configurations of the lighting device with in each case the same configuration of the electronic semiconductor chip and using different light-emitting semiconductor chips. The light-emitting semiconductor chips may differ from one another for example in terms of the size, the shape and/or the number of light-emitting pixels. Depending on the light-emitting semiconductor chip respectively used, a carrier coordinated therewith may be used. The coordination may be effected for example with regard to the size of the light-emitting semiconductor chip and with regard to constituent parts of the light-emitting semiconductor chip such as light-emitting pixels and the number thereof, and contact elements of the light-emitting semiconductor chip and the number thereof. The high flexibility and scalability available in this way make it possible, for example, to react rapidly to changed market or customer requirements.

The method may be employed for producing the lighting device described above or one or more of the above-described embodiments of the lighting device. In a corresponding manner, aspects and details described above with reference to the lighting device may also be employed for the production method.

By way of example, the pixelated light-emitting semiconductor chip and the electronic semiconductor chip may be arranged and mounted directly on the carrier or on one side of the carrier using a connecting material. In the completed lighting device, the connecting material may respectively adjoin the carrier and one of the semiconductor chips. The connecting material may be electrically conductive, and for example a solder or an adhesive or an electrically conductive adhesive. Contact elements of electrical conductor structures of the carrier and contact elements of the semiconductor chips may in each case be electrically connected by way of the connecting material.

The advantageous configurations and developments of the invention explained below and/or presented in the dependent claims may—apart from, for example, in cases of clear dependencies or incompatible alternatives—be employed individually or else in any desired combination with one another.

The above-described properties, features and advantages of this invention and the way in which they are achieved will become clearer and more clearly understood in association with the following description of exemplary embodiments which are explained in greater detail in association with the schematic drawings, in which.

Figure 9:
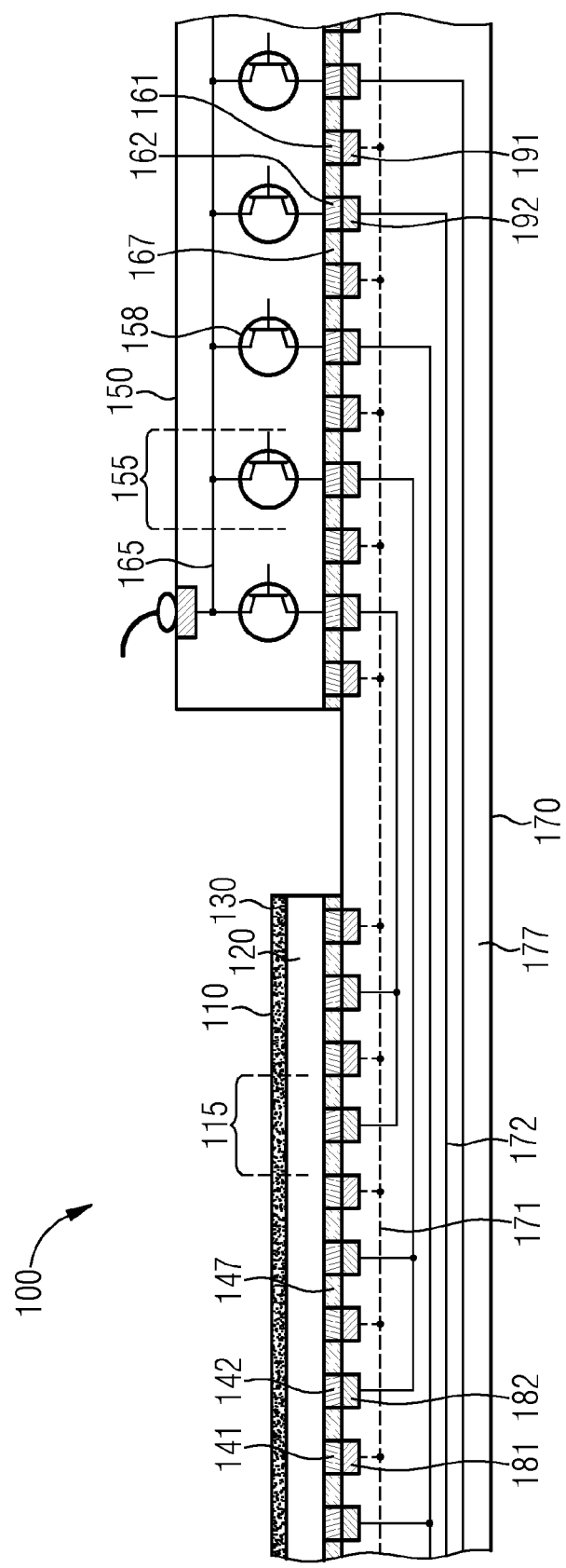
Figure 10:
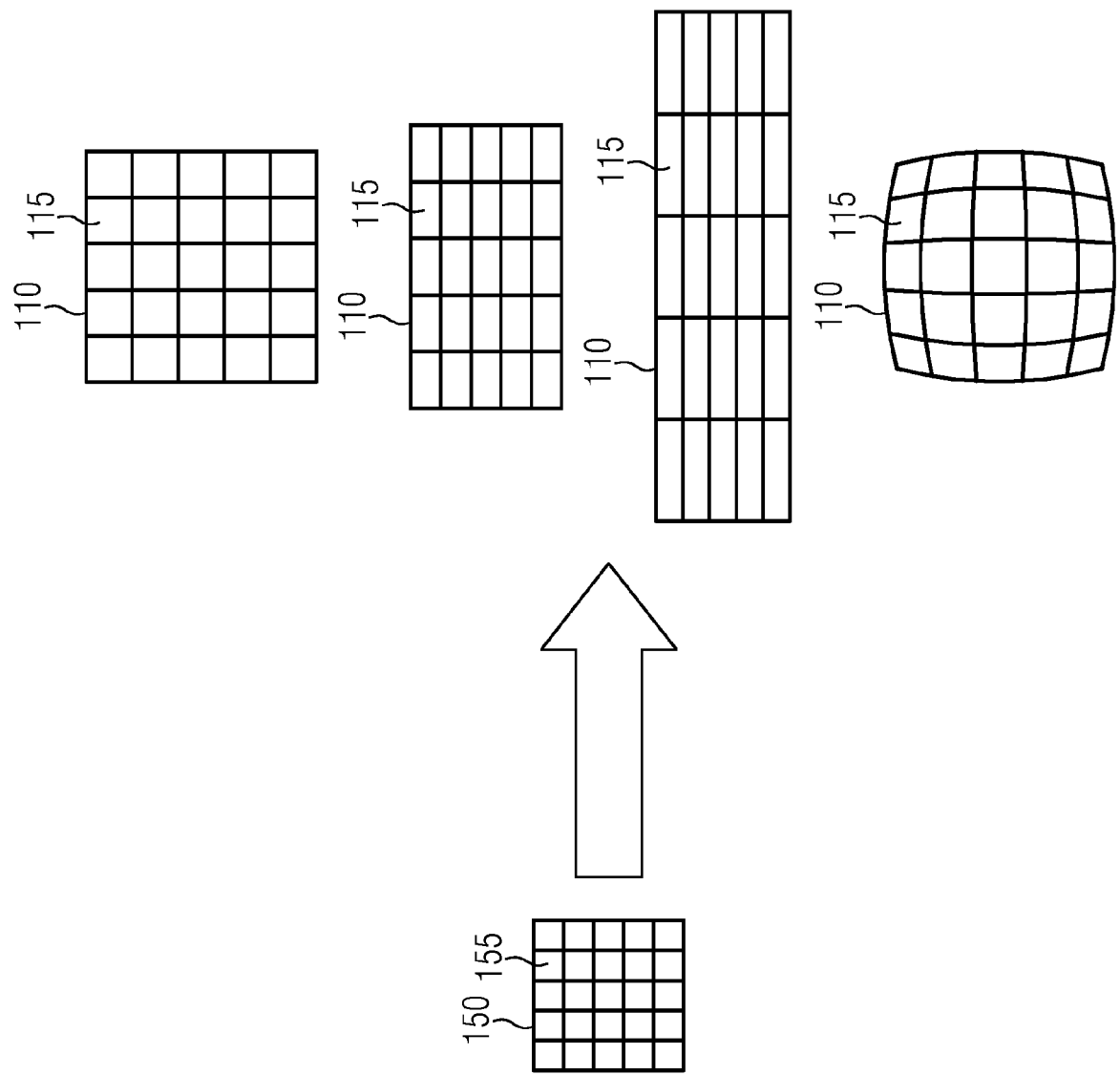

FIG. 9 shows a lateral illustration of a further lighting device comprising a pixelated light-emitting semiconductor chip, an electronic semiconductor chip and a carrier, wherein pixels of the light-emitting semiconductor chip are connected in parallel with the aid of conductor structures of the carrier; and FIGS. 10 to 12 show plan view illustrations of electronic semiconductor chips and pixelated light-emitting semiconductor chips.

Possible configurations of a lighting device 100 comprising a pixelated light-emitting semiconductor chip 110, an electronic semiconductor chip 150 and a carrier 170 are described with reference to the following schematic figures.

It is pointed out that the schematic figures may not be true to scale. Therefore, components and structures shown in the figures may be illustrated with exaggerated size or size reduction in order to afford a better understanding.

Figure 1:
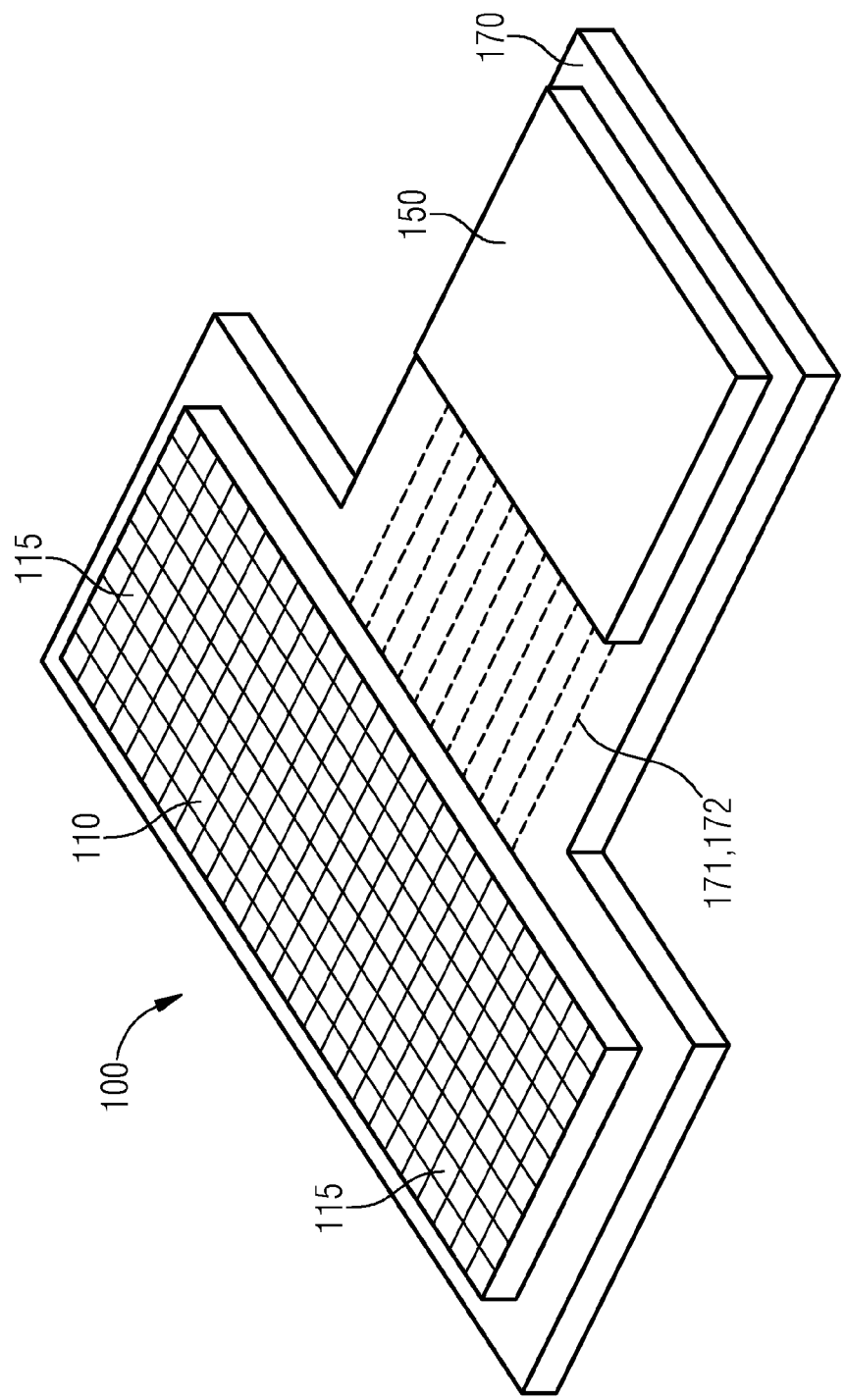
FIG. 1 shows a perspective illustration of a lighting device comprising a pixelated light-emitting semiconductor chip, an electronic semiconductor chip and a carrier, wherein the semiconductor chips are arranged next to one another on the carrier.

FIG. 1 shows a schematic perspective illustration of a pixelated lighting device 100. The lighting device 100 comprises a pixelated light-emitting semiconductor chip 110, an electronic semiconductor chip 150 and a carrier 170. The carrier 170, which may be referred to as a connecting layer, comprises a planar shape and comprises two opposite main sides. The main sides are sides of the carrier 170 having the largest lateral surface area. The semiconductor chips 110, 150 are arranged next to one another on one of the main sides of the carrier 170, and are secured directly on the carrier 170 using a connecting material. The connecting material used is a solder 240, as is illustrated for the light-emitting semiconductor chip 110 in FIGS. 4 and 5.

Figure 4:
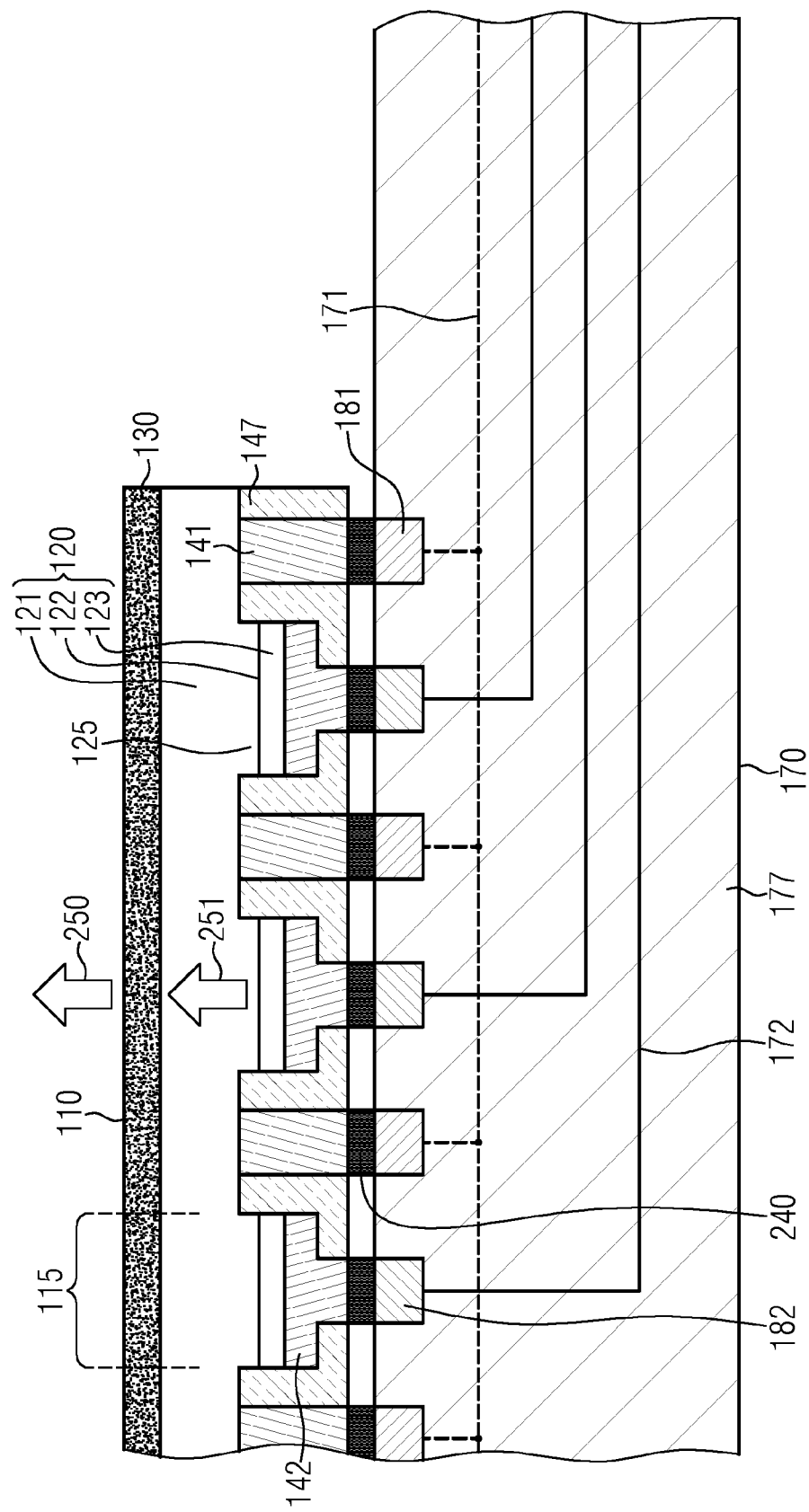
FIGS. 4 and 5 show enlarged lateral illustrations of the lighting device in a region of the light-emitting semiconductor chip.

The light-emitting semiconductor chip 110 comprises a pixel arrangement comprising pixels 115 which are arranged next to one another and which are configured for generating light radiation 250 (cf. FIG. 4). As is illustrated in FIG. 1, the light-emitting pixels 115 are arranged next to one another in a matrixlike fashion in the form of rows and columns. The pixels 115 are drivable separately from one another, and may consequently be operated individually and independently of one another for the emission of the light radiation 250. As a result, in a flexible manner different light patterns may be provided in an illumination region (not illustrated). The light-emitting semiconductor chip 110 may be realized in the form of a micro-structured pixelated LED chip (light-emitting diode).

The lighting device 100 shown in FIG. 1 may be for example part of a headlight of an adaptive lighting system used in the automotive field. Furthermore, for example an optical unit for beam shaping may be disposed (not illustrated) downstream of the lighting device 100. With regard to this application, the light radiation 250 emitted by the light-emitting semiconductor chip 110 may be white light radiation.

The electronic semiconductor chip 150 of the lighting device 100, which may also be referred to as a driver chip or IC chip (integrated circuit), serves for electrically driving the pixelated light-emitting semiconductor chip 110. For this purpose, the electronic semiconductor chip 150 comprises a multiplicity of driver cells 155 arranged next to one another and having circuit structures 158, with the aid of which the pixels 115 of the light-emitting semiconductor chip 110 may be electrically driven (cf. FIG. 3). The driver cells 155 may likewise be arranged next to one another in a matrixlike fashion in the form of rows and columns (cf. FIG. 10).

The carrier 170 of the lighting device 100 shown in FIG. 1 serves not only for carrying the semiconductor chips 110, 150, but also for providing an electrical connection between the semiconductor chips 110, 150. For this purpose, the carrier 170 comprises a multiplicity of electrical conductor structures 171, 172, as is indicated on the basis of dashed lines in FIG. 1. The conductor structures 171, 172 may be embodied at least partly in metallic fashion. Appropriate metallic materials are aluminum and/or copper, for example. Furthermore, the conductor structures 171, 172 may comprise constituent parts such as—described further below—contact elements 181, 182, 191, 192 (cf. FIG. 3), conductor tracks and/or vias (vertical interconnect access). By way of the conductor structures 171, 172, the driver cells 155 of the electronic semiconductor chip 150 and the pixels 115 of the light-emitting semiconductor chip 110 are electrically connected to one another, such that the pixels 115 may be driven for light emission by way of the driver cells 155. In this case, the conductor structures 171, 172 provide for an assignment between the pixels 115 and driver cells 155.

The use of the carrier 170 in the lighting device 100 enables a spatial separation of the semiconductor chips 110, 150. As is shown in FIG. 1, the semiconductor chips 110, 150 are arranged on the carrier 170 at a distance from one another. This configuration is associated with thermal decoupling of the semiconductor chips 110, 150. In this way, merely a low or negligible thermal loading of the electronic semiconductor chip 150 by thermal energy generated by the light-emitting semiconductor chip 110 may occur during the operation of the lighting device 100. The spatial distance furthermore makes it possible to suppress a situation in which the light radiation 250 emitted by the light-emitting semiconductor chip 110 passes to the electronic semiconductor chip 150 and is coupled into the latter. A long lifetime and a reliable manner of operation of the electronic semiconductor chip 150 with a low risk of disturbance are possible as a result. This correspondingly applies to the lighting device 100.

The arrangement of the semiconductor chips 110, 150 next to one another as provided in the lighting device 100 furthermore affords the possibility of designing the semiconductor chips 110, 150 largely independently of one another, for example with regard to the geometric shape and the form factor of the semiconductor chips 110, 150 and of constituent parts of the semiconductor chips 110, 150 such as their pixels 115 and driver cells 155. In this way the lighting device 100 may be realized cost-effectively, for example. Furthermore, a high flexibility and scalability with regard to production of the lighting device 100 may be made available.

As a possible example of independent design, FIG. 1 illustrates a configuration of the semiconductor chips 110, 150 comprising different chip shapes. In this case, the semiconductor chips 110, 150, as seen in plan view, comprise different contours and different sizes. The light-emitting semiconductor chip 110 comprises a rectangular non-square shape, whereas the electronic semiconductor chip 150 comprises a square shape. Moreover, the light-emitting semiconductor chip 110 comprises larger lateral dimensions than the electronic semiconductor chip 150. The carrier 170 of the lighting device 100, in a manner coordinated therewith, comprises a T-shaped contour.

Figure 2:
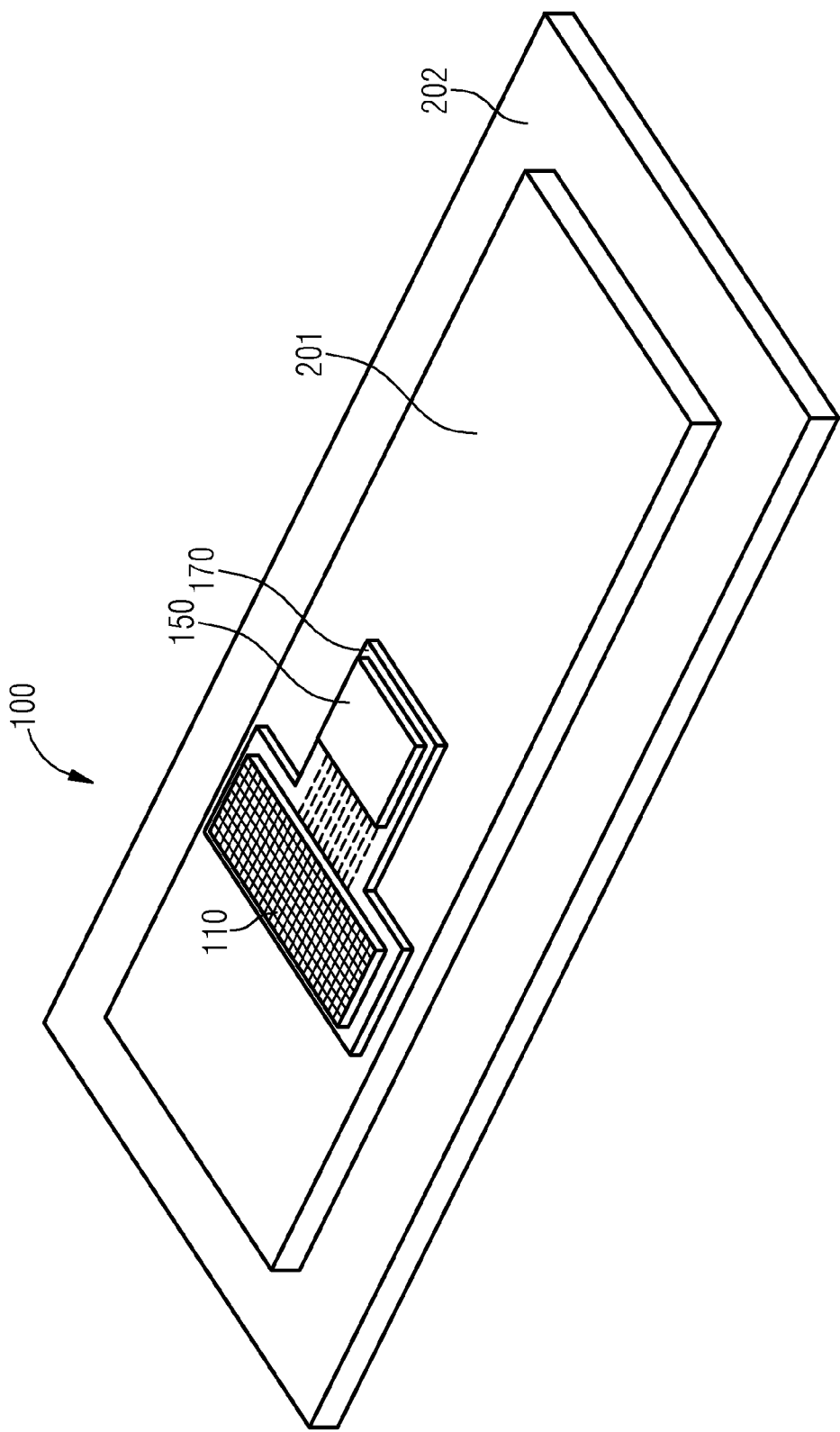
FIG. 2 shows a perspective illustration of the lighting device with further carriers.

The lighting device 100 may be realized with at least one further constituent part, for example at least one further carrier, in addition to the constituent parts shown in FIG. 1. For exemplary elucidation, FIG. 2 shows a schematic perspective illustration of the lighting device 100 with two further carriers 201, 202. In this way, the carrier 170 is located on the carrier 201, and the carrier 201 is arranged on the carrier 202. The carrier 201 may be for example a printed circuit board (PCB) or a metal core printed circuit board (MCPCB). The other carrier 202 may be a metallic carrier, for example. The carriers 201, 202 may be used for example for achieving efficient heat dissipation during operation of the lighting device 100.

Figure 3:
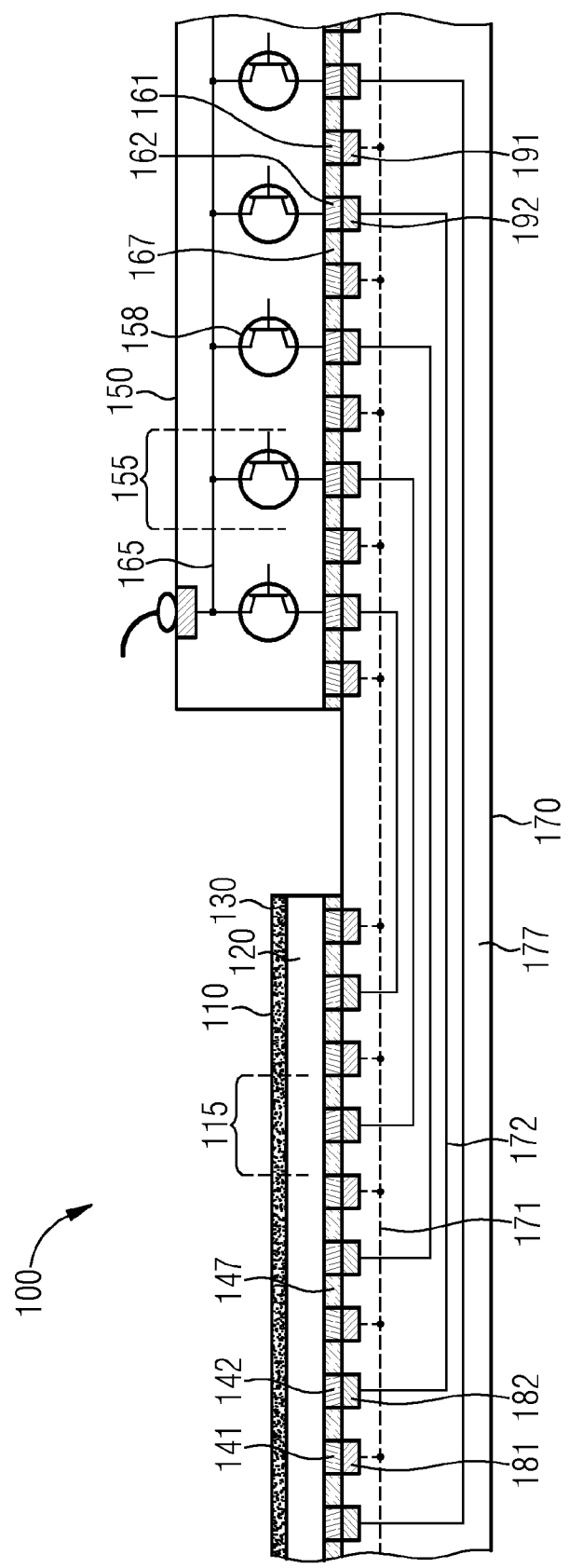
FIG. 3 shows a lateral illustration of the lighting device, wherein an electrical interconnection of the semiconductor chips with the aid of conductor structures of the carrier is illustrated.

FIG. 3 shows a schematic lateral illustration of the lighting device 100, with reference to which further details with regard to the carrier 170, the semiconductor chips 110, 150 arranged thereon, and their electrical connection will become clear. The light-emitting semiconductor chip 110 comprises a semiconductor layer sequence 120 for generating primary radiation and a conversion layer 130 for radiation conversion. The conversion layer 130 is located on the side of the semiconductor layer sequence 120 facing away from the carrier 170. As will be explained in even greater detail further below, the pixels 115 of the light-emitting semiconductor chip 110 are formed by the semiconductor layer sequence 120 and the conversion layer 130.

On a side facing the carrier 170, the light-emitting semiconductor chip 110 furthermore comprises a contact structure connected to the semiconductor layer sequence 120, with the aid of which contact structure the semiconductor layer sequence 120 may be supplied with electrical energy for generating light. The contact structure of the light-emitting semiconductor chip 110 comprises separate contact elements 142, each of which is assigned to one of the pixels 115, and a continuous contact element 141. The contact element 141 comprises cutouts within which the other contact elements 142 are arranged (cf. FIG. 6). The continuous contact element 141 may serve as an anode, and the contact elements 142 may serve as cathodes. The contact elements 141, 142 may be embodied at least partly in metallic fashion. For increasing the reliability, on the side facing the carrier 170 the light-emitting semiconductor chip 110 comprises an insulation 147 separating the contact elements 141, 142. The insulation 147 may comprise an electrically insulating material such as, for example, silicon oxide, silicon nitride or polyimide.

The carrier 170 of the lighting device 100 comprises a carrier material 177, besides the conductor structures 171, 172 mentioned above. The carrier material 177 may be an insulating material such as, for example, a ceramic material, silicon oxide, silicon nitride, polyimide or a semiconductor material such as silicon, for example. As is shown in FIG. 3, the conductor structures 171, 172 may be embedded partly in the carrier material 177 of the carrier 170.

The carrier 170 or the conductor structures 171, 172 thereof comprise a contact structure coordinated with the contact structure of the light-emitting semiconductor chip 110. This involves separate contact elements 182 and a continuous contact element 181 comprising cutouts within which the contact elements 182 are arranged. A configuration corresponding to the contact elements 141, 142 of the light-emitting semiconductor chip 110 is present here. Each of the contact elements 182 is electrically connected to one of the contact elements 142, and the contact element 181 is electrically connected to the contact element 141. The electrical connection is established in each case by way of the solder 240 used for mounting the semiconductor chips 110, 150 on the carrier 170, as is illustrated for the light-emitting semiconductor chip 110 in FIGS. 4 and 5.

The electronic semiconductor chip 150 likewise comprises, as is shown in FIG. 3, a contact structure on a side facing the carrier 170. The contact structure of the electronic semiconductor chip 150 comprises separate contact elements 162 and a continuous contact element 161 comprising cutouts within which the contact elements 162 are arranged. A configuration corresponding to the contact structure of the light-emitting semiconductor chip 110 may be present here. The continuous contact element 161 may serve as an anode, and the contact elements 162 may serve as cathodes. The contact elements 161, 162 may be embodied at least partly in metallic fashion. For increasing the reliability, on the side facing the carrier 170 the electronic semiconductor chip 150 comprises an insulation 167 separating the contact elements 161, 162. The insulation 167, in a manner corresponding to the insulation 147 of the light-emitting semiconductor chip 110, may comprise an electrically insulating material such as, for example, silicon oxide, silicon nitride or polyimide.

In a manner corresponding to the contact structure of the electronic semiconductor chip 150, the carrier 170 or the conductor structures 171, 172 of the carrier 170 comprise(s) a contact structure coordinated therewith. In this sense the carrier 170 comprises separate contact elements 192 and a continuous contact element 191 comprising cutouts within which the contact elements 192 are arranged. A configuration corresponding to the contact elements 161, 162 of the electronic semiconductor chip 150 is present here. Each of the contact elements 192 is electrically connected to one of the contact elements 162, and the contact element 191 is electrically connected to the contact element 161. At this point, too, the electrical connection is established by way of the solder 240 used for mounting the semiconductor chips 110, 150 on the carrier 170, as is illustrated for the light-emitting semiconductor chip 110 in FIGS. 4 and 5.

With regard to the electrical connection of the semiconductor chips 110, 150, the carrier 170, as is illustrated in FIG. 3, comprises a plurality of conductor structures 172 and a continuous conductor structure 171 indicated in a dashed manner. The conductor structures 172 in each case comprise a contact element 182 and a contact element 192, such that a contact element 182 and a contact element 192 are electrically connected in each case. Consequently, by way of the conductor structures 172 of the carrier 170, a contact element 142 of the light-emitting semiconductor chip 110 and a contact element 162 of the electronic semiconductor chip 150 are in each case electrically connected to one another. The other conductor structure 171 of the carrier 170 comprises the continuous contact elements 181, 191, which are thus electrically connected. Consequently, the continuous contact element 141 of the light-emitting semiconductor chip 110 and the continuous contact element 161 of the electronic semiconductor chip 150 are electrically connected to one another by way of the conductor structure 171 of the carrier 170.

With reference to FIG. 3 it furthermore becomes clear that the electronic semiconductor chip 150 comprises a semiconductor body comprising silicon, for example, in which the driver cells 155 mentioned above are formed. Each of the driver cells 155 comprises a switch 158. The switches 158 may be realized in the form of transistors. The switches 158 are electrically connected to the contact elements 162, and to an externally contactable conductor structure 165 of the electronic semiconductor chip 150. The continuous contact element 161 may be electrically connected to a further, externally contactable conductor structure (not illustrated) of the electronic semiconductor chip 150. The conductor structure 165 and the further conductor structure (not illustrated) may be contacted with the aid of bond wires, for example, as is indicated with regard to the conductor structure 165 in FIG. 3. In this way the electronic semiconductor chip 150 or the conductor structures thereof may be connected to a current source (not illustrated). During operation of the lighting device 100, as a consequence, by means of selective switching of the switches 158 of the driver cells 155 of the electronic semiconductor chip 150, individual, a plurality or all of the pixels 115 of the light-emitting semiconductor chip 110 may be energized by way of the conductor structures 171, 172 of the carrier 170 and be supplied with constant current, for example, and thereby be driven for light emission.

FIG. 4 shows an enlarged schematic lateral illustration of the lighting device 100 in the region of the light-emitting semiconductor chip 110, with reference to which further possible details with regard to the light-emitting semiconductor chip 110 will become clear. The semiconductor layer sequence 120 of the light-emitting semiconductor chip 110 comprises a structured side facing the carrier 170. Light-emitting regions 125 projecting in the direction of the carrier 170 are present at this location. The light-emitting regions 125 are separated by trenches which together form a grid-shaped trench structure enclosing the regions 125.

As is furthermore illustrated in FIG. 4, the semiconductor layer sequence 120 comprises a continuous first semiconductor region 121 of a first conduction type and, in each of the light-emitting regions 125, in each case a second semiconductor region 123 of a second conduction type, which is different than the first conduction type, and an active zone 122 located between the first semiconductor region 121 and the second semiconductor regions 123. The first semiconductor region 121 may be n-conducting, and the second semiconductor regions 123 may be p-conducting. The active zones 122 are configured for generating primary light radiation 251. The active zones 122 may be configured in the form of a p-n junction, a single quantum well structure or a multiple quantum well structure.

The conversion layer 130 arranged on the semiconductor layer sequence 120 is configured to convert the primary light radiation 251 generated by the active zones 122 of the light-emitting regions 125 during operation and emitted in the direction of the conversion layer 130 partly into secondary light radiation. The primary light radiation and the secondary light radiation, which may be emitted together in the form of superimposed mixed radiation 250 by the conversion layer 130, may be blue light radiation and yellow light radiation. In this way, as mentioned above, white light radiation 250 may be emitted by the lighting device 100.

With regard to the pixels 115 of the light-emitting semiconductor chip 110, each pixel 115 is formed by a light-emitting region 125 of the semiconductor layer sequence 120 and a region of the conversion layer 130 through which the primary radiation 251 from the relevant light-emitting region 125 passes during operation. The pixel shapes of the pixels 115 are predefined by the lateral geometric shape of the light-emitting regions 125 of the semiconductor layer sequence 120.

With reference to FIG. 4, it further becomes clear that the continuous contact element 141 of the light-emitting semiconductor chip 110 is connected to the first semiconductor region 121 of the semiconductor layer sequence 120 laterally with respect to the light-emitting regions 125 and within the trench structure separating the light-emitting regions 125. The other contact elements 142, which may comprise a stepped or T-shaped cross-sectional shape, are connected respectively to one of the second semiconductor regions 123. As a result, the light-emitting regions 125 and thus the pixels 115 of the light-emitting semiconductor chip 110 may be driven for generating light independently of one another by way of the driver cells 155 of the electronic semiconductor chip 150.

Figure 5:
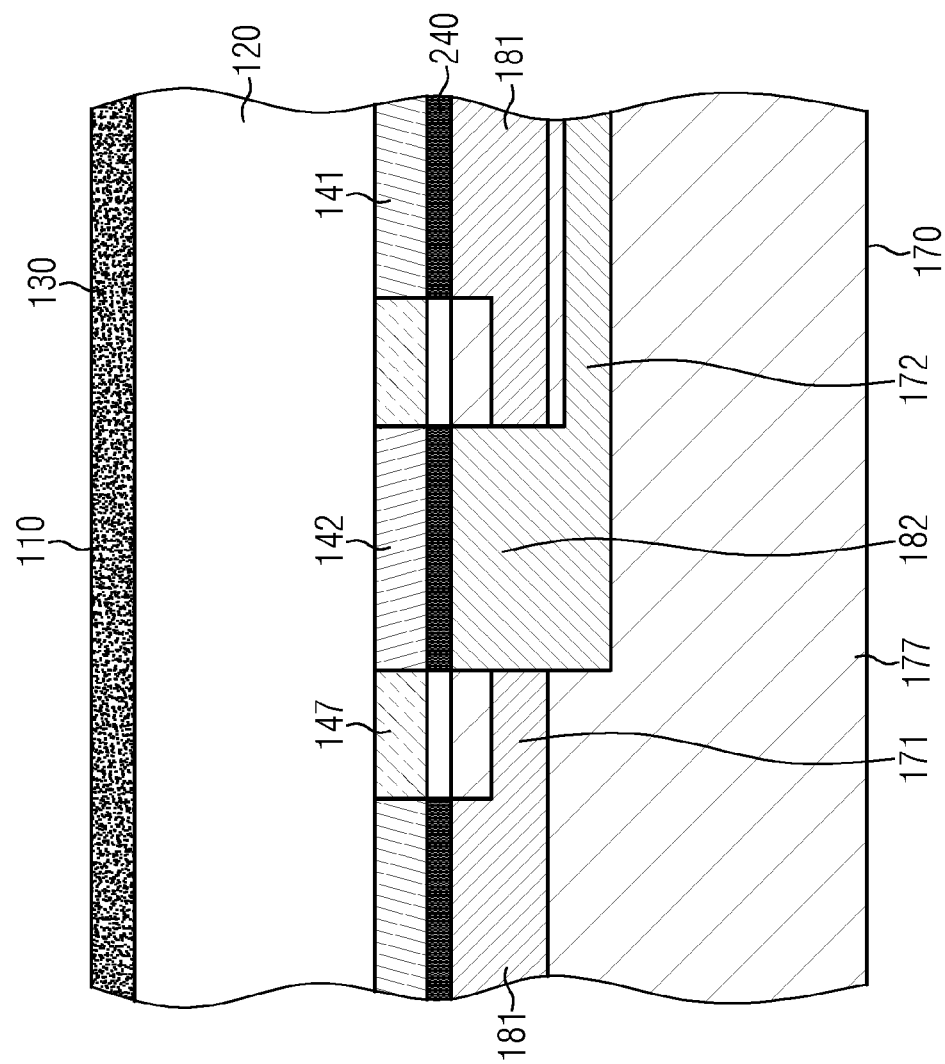

FIG. 5 shows a further enlarged schematic lateral illustration of the lighting device 100 in the region of the light-emitting semiconductor chip 110. It is pointed out in this context that in FIG. 5, as also in FIG. 3, for reasons of clarity, a simplified illustration deviating from FIG. 4 is shown for the semiconductor layer sequence 120 and the contact structure of the light-emitting semiconductor chip 110. With reference to FIG. 5 it becomes clear that the conductor structure 171 of the carrier 170 comprising the continuous contact element 181 may be led partly laterally (i.e. laterally offset with respect to the sectional plane of FIG. 5) past the conductor structures 172 of the carrier 170 comprising the contact elements 182.

Figure 6:
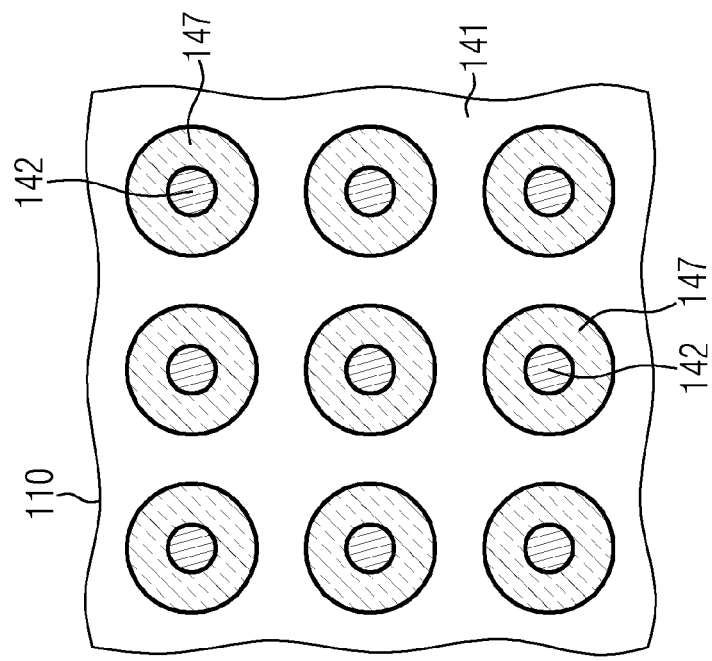
FIGS. 6 and 7 show plan view illustrations of contact structures of the semiconductor chips.

FIG. 6 shows a schematic plan view illustration of a possible configuration of the contact structure of the light-emitting semiconductor chip 110. The continuous contact element 141 comprises circular cutouts within which the other contact elements 142 are arranged. The contact elements 142 comprise a circular contour. The cutouts of the contact element 141 and the contact elements 142 are arranged in a regular periodic grid. The contact structure of the carrier 170 comprising the contact elements 181, 182, which contact structure is assigned to the light-emitting semiconductor chip 110, may comprise an appearance corresponding to FIG. 6, as seen in plan view. In this case, the continuous contact element 181 may comprise circular cutouts, and the contact elements 182 arranged within the cutouts may comprise a circular contour (not illustrated).

In a corresponding manner there is the possibility of the contact structure of the electronic semiconductor chip 150, as seen in plan view, comprising an appearance corresponding to FIG. 6, that is to say that the continuous contact element 161 comprises circular cutouts and the contact elements 162 arranged within the cutouts comprise a circular contour. This correspondingly applies to the contact structure of the carrier 170 which is assigned to the electronic semiconductor chip 150 and in which the continuous contact element 191 may comprise circular cutouts and the contact elements 192 arranged within the cutouts may comprise a circular contour (not illustrated in each case).

Figure 7:
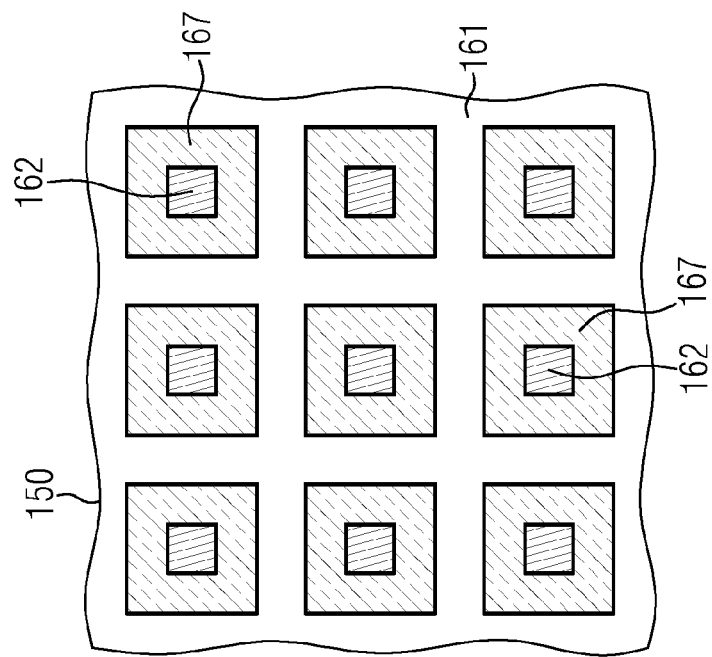

However, independently designing the semiconductor chips 110, 150 of the lighting device 100 also affords the possibility of configuring the contact structures of the semiconductor chips 110, 150 in a manner deviating from one another. For exemplary elucidation, FIG. 7 shows a schematic plan view illustration of a possible configuration of the contact structure of the electronic semiconductor chip 150 which differs from the configuration shown in FIG. 6. In this case, the continuous contact element 161 of the electronic semiconductor chip 150 comprises rectangular or square cutouts within which the other contact elements 162 are arranged. The contact elements 162 comprise a rectangular or square contour. The contact structure of the carrier 170 which is assigned to the electronic semiconductor chip 150 may comprise, as seen in plan view, an appearance corresponding to FIG. 7 with rectangular or square cutouts of the contact element 191 and a rectangular or square contour of the contact elements 192 (not illustrated).

A description is given below of further possible variants and configurations which may be considered in regard to a lighting device 100 described here. Corresponding features and details and also identical and identically acting components are not described in a detailed manner again below. For details in respect thereof, reference is instead made to the description above. Furthermore, aspects and details mentioned with regard to one configuration may also be applied with regard to another configuration and features of two or more configurations may be combined with one another.

Figure 8:
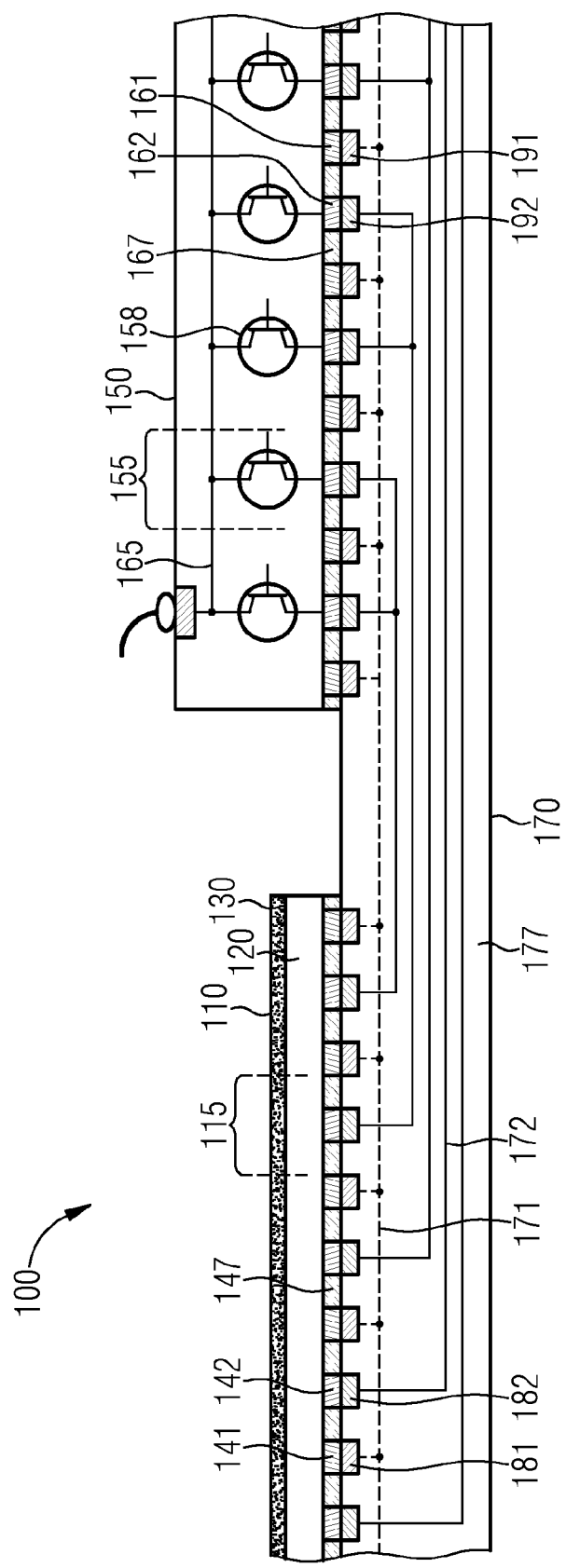
FIG. 8 shows a lateral illustration of a further lighting device comprising a pixelated light-emitting semiconductor chip, an electronic semiconductor chip and a carrier, wherein driver cells of the electronic semiconductor chips are connected in parallel with the aid of conductor structures of the carrier.

FIG. 8 shows a schematic lateral illustration of a further lighting device 100 comprising a carrier 170, on which a pixelated light-emitting semiconductor chip 110 and a electronic semiconductor chip 150 are arranged next to one another. In contrast to FIG. 3, in the lighting device 100 in FIG. 8, in each case two driver cells 155 and thus switches 158 of the electronic semiconductor chip 150 are electrically short-circuited and thereby connected in parallel. Consequently, in each case two driver cells 155 are electrically connected to the pixels 115 of the light-emitting semiconductor chip 110, and in this respect each pixel 115 may be electrically driven simultaneously by means of two driver cells 155. An increase or doubling of the electric current applied to a driven pixel 115 may be achieved in this way.

The parallel connection of driver cells 155 as shown in FIG. 8 is realized by virtue of the fact that each conductor structure 172 of the carrier 170 comprises a contact element 182 and two contact elements 192, and these three contact elements 182, 192 are thus electrically connected by way of the associated conductor structure 172. In this way, in each case two contact elements 162 of the electronic semiconductor chip 150 and a contact element 142 of the light-emitting semiconductor chip 110 are electrically connected to one another. The configuration shown in FIG. 8 may be employed if the number of driver cells 155 of the electronic semiconductor chip 150 is greater than or double the magnitude of the number of pixels 115 of the light-emitting semiconductor chip 110.

In accordance with FIG. 8 further configurations of a lighting device 100 are conceivable in which a larger number of driver cells 155 of the electronic semiconductor chip 150 are in each case connected in parallel and electrically connected to one of the pixels 115 of the light-emitting semiconductor chip 110. Furthermore, configurations are possible in which different numbers of driver cells 155 of the electronic semiconductor chip 150 are electrically connected to pixels 115 of the light-emitting semiconductor chip 110, and in which, consequently, pixels 115 may be electrically driven by different numbers of driver cells 155. In this sense a configuration of a lighting device 100 may be considered, for example, in which, in one group of pixels 115 of the light-emitting semiconductor chip 110, the pixels 115 are drivable by in each case one driver cell 155 of the electronic semiconductor chip 150, and in which, in another group of pixels 115, the pixels 115 are drivable by in each case a plurality of (for example two) driver cells 155. Such variants may be realized by a corresponding configuration of conductor structures 172 of the carrier 170 (not illustrated in each case).

FIG. 9 shows a schematic lateral illustration of a further lighting device 100 comprising semiconductor chips 110, 150 arranged on a carrier 170. In contrast to FIG. 3, in the lighting device 100 in FIG. 9, in each case two pixels 115 of the light-emitting semiconductor chip 110 are electrically short-circuited and thereby connected in parallel. Consequently, a corresponding driver cell 155 of the electronic semiconductor chip 150 is electrically connected to in each case two pixels 115 of the light-emitting semiconductor chip 110, and in this respect in each case two pixels 115 may be electrically driven simultaneously by each of the driver cells 155.

The parallel connection of pixels 115 as illustrated in FIG. 9 is realized by virtue of the fact that each conductor structure 172 of the carrier 170 comprises two contact elements 182 and a contact element 192, and these three contact elements 182, 192 are thus electrically connected by way of the associated conductor structure 172. As a result, in each case two contact elements 142 of the light-emitting semiconductor chip 110 and a contact element 162 of the electronic semiconductor chip 150 are electrically connected to one another. The configuration shown in FIG. 9 may be applied if the number of pixels 115 of the light-emitting semiconductor chip 110 is greater than or double the magnitude of the number of driver cells 155 of the electronic semiconductor chip 150.

In accordance with FIG. 9 further configurations of a lighting device 100 may be considered in which a larger number of pixels 115 of the light-emitting semiconductor chip are in each case connected in parallel and electrically connected to one of the driver cells 155 of the electronic semiconductor chip 150. Furthermore, configurations are possible in which driver cells 155 of the electronic semiconductor chip are electrically connected to different numbers of pixels 115 of the light-emitting semiconductor chip 110, and which in this respect are suitable for driving different numbers of pixels 115. One example is a configuration of a lighting device 100 in which, in one group of driver cells 155 of the electronic semiconductor chip 150, only in each case one pixel 115 of the light-emitting semiconductor chip is drivable by the driver cells 155, and in which, in another group of driver cells 155, in each case a plurality of (for example two) pixels 115 are drivable by the driver cells 155. Such variants may be realized by a corresponding configuration of conductor structures 172 of the carrier 170 (not illustrated in each case).

Configurations of a lighting device 100 which comprise mixed forms of the configurations mentioned above are furthermore conceivable. Such lighting devices 100 may comprise both parallel-connected driver cells 155 and parallel-connected pixels 115 (not illustrated).

In order to produce a lighting device 100 described here, a pixelated light-emitting semiconductor chip 110, an electronic semiconductor chip 150 suitable for driving the light-emitting semiconductor chip 110, and a carrier 170 are provided. Furthermore, the semiconductor chips 110, 150 are arranged next to one another on the carrier 170. Chip mounting is effected using a connecting material or solder 240. As was indicated above, this procedure affords the possibility of designing the semiconductor chips 110, 150 largely independently of one another. Furthermore, a high flexibility and scalability in regard to production may be made available.

In this sense a lighting device 100 may be realized in which there are for example different chip shapes of the semiconductor chip 110, 150, i.e. as seen in plan view different contours and geometric shapes of the semiconductor chips 110, 150 and/or different sizes and area dimensions of the semiconductor chips 110, 150.

This is the case for example for the lighting device 100 shown in FIG. 1. There may be a further possible difference with regard to the number of pixels 115 of the light-emitting semiconductor chip 110 and the number of driver cells 155 of the electronic semiconductor chip 150. In regard to such configurations, consideration may be given to parallel connections of pixels 115 and/or driver cells 155, as has been explained with reference to FIGS. 8 and 9. Furthermore, a lighting device 100 may be realized in which for example the pixels 115 and driver cells 155 of the semiconductor chips 110, 150 differ from one another in terms of the shapes, i.e.—as seen in plan view—in terms of the contours and geometric shapes and/or in terms of the sizes and area dimensions.

Furthermore, the possibility is afforded of using one and the same configuration of an electronic semiconductor chip 150 for different configurations of pixelated light-emitting semiconductor chips 110. This allows a scalability of the light-emitting semiconductor chip 110, and makes it possible to realize different configurations of a lighting device 100 in a flexible manner. The light-emitting semiconductor chips 110 may differ from one another in terms of the size, the shape and/or the number of pixels 115.

For exemplary elucidation of this aspect, FIG. 10 shows schematic plan view illustrations of an electronic semiconductor chip 150 and of different configurations of a pixelated light-emitting semiconductor chip 110. The electronic semiconductor chip 150 is suitable for driving all of the light-emitting semiconductor chips 110 shown in FIG. 10. In the present case, the electronic semiconductor chip 150 comprises a square contour and twenty-five driver cells 155 comprising a square contour. The topmost light-emitting semiconductor chip 110 shown in FIG. 10 comprises a square contour and twenty-five pixels 115 comprising a square contour. The semiconductor chip 110 is larger than the semiconductor chip 150. Moreover the pixels 115 are larger than the driver cells 155.

The middle two light-emitting semiconductor chips 110 shown in FIG. 10 comprise a rectangular non-square contour and twenty-five pixels 115 comprising a rectangular non-square contour. Consequently, there are different aspect ratios with regard to the contours of the semiconductor chips 110, 150 and with regard to the contours of pixels 115 and driver cells 155. Furthermore, the semiconductor chips 110 are larger than the semiconductor chip 150, and the pixels 115 are larger than the driver cells 155.

A further possible difference between the semiconductor chips 110, 150 may consist in the driver cells 155 of the electronic semiconductor chip 150 comprising a uniform plan view shape, and in the light-emitting semiconductor chip 110 comprising pixels 115 comprising different pixel shapes, that is to say different contour shapes and/or different lateral dimensions of pixels 115. One possible example of this is illustrated by the bottommost light-emitting semiconductor chip 110 shown in FIG. 10. The semiconductor chip 110 comprises a shape deviating from a rectangular or square shape and comprising outwardly curved pixel sides, and comprising twenty-five pixels 115 comprising pixel shapes which are distorted and which deviate from a rectangular or square shape to different extents. The distortion, corresponding to a barrel-shaped distortion of a rectangular grid, increases in the direction of the edge and the corners of the semiconductor chip 110.

Different lighting devices 100 may be produced using the different light-emitting semiconductor chips 110 shown in FIG. 10 and a respective electronic semiconductor chip 150 as shown in FIG. 10. In each case different carriers 170 coordinated with the light-emitting semiconductor chips 110 may be used here. The coordination may be effected with regard to the size and shape of the semiconductor chips 110 and with regard to constituent parts of the semiconductor chips 110 such as the contact elements thereof, for example. In this case, carriers 170 may be used which, in a departure from FIG. 1, may comprise a different contour, for example a rectangular or square contour (not illustrated in each case).

In regard to FIG. 10 (and also the following FIGS. 11 and 12) it is furthermore pointed out that semiconductor chips 110, 150 comprising other or (significantly) larger numbers of pixels 115 and driver cells 155 may be employed. FIG. 1 shows for example a light-emitting semiconductor chip 110 comprising a larger number of pixels 115. Possible numbers of pixels 115 and driver cells 155 may be in the three-digit to five-digit range, for example.

As has been described above, lighting devices 100 may be realized in which the numbers of pixels 115 and of driver cells 155 of the semiconductor chips 110, 150 used differ from one another. For exemplary elucidation, FIG. 11 shows a schematic plan view illustration of an electronic semiconductor chip 150 and a light-emitting semiconductor chip 110 that is drivable by the latter. The semiconductor chip 150 comprises a square contour and twenty-five driver cells 155 comprising a square contour. In contrast thereto, the light-emitting semiconductor chip 110 comprises fifty pixels 115 comprising a rectangular non-square contour. The pixels 115 are furthermore present in two different pixels sizes and pixel shapes. Moreover, the semiconductor chip 110 comprises a T-shaped contour. In the case of a lighting device 100 constructed from the semiconductor chips 110, 150, the driving of the semiconductor chip 110 by the semiconductor chip 150 may be realized for example with the aid of a carrier 170 configured in accordance with FIG. 9, that is to say that in each case two pixels 115 are connected in parallel.

Further possible configurations will become clear with reference to FIG. 12, which shows schematic view illustrations of an electronic semiconductor chip 150 and of two light-emitting semiconductor chips 110 that are drivable with the aid of the semiconductor chip 150. The electronic semiconductor chip 150 comprises a rectangular non-square contour comprising fifty square driver cells 155. In contrast thereto, the two light-emitting semiconductor chips 110 shown in FIG. 12 comprise twenty-five pixels 115. In this case the upper semiconductor chip 110 shown in FIG. 12 comprises a square contour and square pixels 115. The lower semiconductor chip 110 shown in FIG. 12 comprises a rectangular non-square contour and rectangular non-square pixels 115. In the case of a lighting device 100 constructed from the semiconductor chip 150 and one of the semiconductor chips 110, the driving of the semiconductor chip 110 by the semiconductor chip 150 may be effected for example with the aid of a carrier 170 realized in accordance with FIG. 8, that is to say that in each case two driver cells 155 are connected in parallel.

Besides the embodiments described above and depicted in the figures, further embodiments are conceivable which may comprise further modifications and/or combinations of features.

It is possible, for example, to provide, instead of the shapes described and shown in the figures, other shapes for semiconductor chips 110, 150, for carriers 170 and/or for constituent parts of semiconductor chips 110, 150 and carriers 170 such as, for example, pixels 115, driver cells 155 and contact structures. In this sense, pixels 115 comprising a round shape, a letter shape, or a shape reproducing an image or a symbol may be considered, for example.

Furthermore, other materials may be used instead of the materials mentioned above. Moreover, light radiations comprising different colors than those mentioned above may be generated, by way of a corresponding configuration of a light-emitting semiconductor chip 110 or of a semiconductor layer sequence 120 and a conversion element 130.

A further possible modification consists in using, instead of a solder 240, some other electrically conductive connecting material such as, for example, an electrically conductive adhesive for mounting semiconductor chips 110, 150 on a carrier 170.

With regard to contact structures of semiconductor chips 110, 150 and carriers 170, it is alternatively possible to provide separate contact elements instead of continuous contact elements 141, 161, 181, 191.

A further possible modification is a lighting device 100 in which the electronic semiconductor chip 150 is larger than the light-emitting semiconductor chip 110 in terms of the lateral dimensions.

Furthermore, a lighting device 100 constructed in accordance with the approaches above may be employed not only in a headlight, but also in other ways, for example for some other external or else internal lighting in the automotive field, or for general lighting.

Although the invention has been more specifically illustrated and described in detail by means of preferred exemplary embodiments, nevertheless the invention is not restricted by the examples disclosed and other variations may be derived therefrom by a person skilled in the art, without departing from the scope of protection of the invention.

LIST OF REFERENCE SIGNS

100 Lighting device
110 Light-emitting semiconductor chip
115 Pixel
120 Semiconductor layer sequence
121 Semiconductor region
122 Active zone
123 Semiconductor region
125 Light-emitting region
130 Conversion layer
141 Contact element
142 Contact element
147 Insulation
150 Electronic semiconductor chip
155 Driver cell
158 Switch
161 Contact element
162 Contact element
165 Conductor structure
167 Insulation
170 Carrier
171 Conductor structure
172 Conductor structure
177 Carrier material
181 Contact element
182 Contact element
191 Contact element
192 Contact element
201 Carrier
202 Carrier
240 Solder
250 Light radiation
251 Light radiation

The invention claimed is:

1. A lighting device, comprising:
a pixelated light-emitting semiconductor chip;
an electronic semiconductor chip for driving the pixelated light-emitting semiconductor chip; and
a carrier,
wherein the pixelated light-emitting semiconductor chip and the electronic semiconductor chip are arranged next to one another on the carrier; and
wherein the pixelated light-emitting semiconductor chip comprises light-emitting pixels, the electronic semiconductor chip comprises driver cells for driving light-emitting pixels of the pixelated light-emitting semiconductor chip, and the number of driver cells of the electronic semiconductor chip exceeds the number of light-emitting pixels of the light-emitting semiconductor chip.

2. The lighting device according to claim 1,
wherein the pixelated light-emitting semiconductor chip and the electronic semiconductor chip comprise different shapes.

3. The lighting device according to claim 1,
wherein different shapes of light-emitting pixels and driver cells are present.

4. The lighting device according to claim 1,
wherein the pixelated light-emitting semiconductor chip and the electronic semiconductor chip are arranged on the carrier at a distance from one another.

5. The lighting device according to claim 1,
wherein the carrier comprises electrical conductor structures, by way of which the pixelated light-emitting semiconductor chip and the electronic semiconductor chip are electrically connected to one another.

6. The lighting device according to claim 1,
wherein driver cells are connected in parallel by way of electrical conductor structures of the carrier.

7. The lighting device according to claim 1,
wherein light-emitting pixels are connected in parallel by way of electrical conductor structures of the carrier.

8. A method for producing the lighting device according to claim 1, comprising:
Providing a pixelated light-emitting semiconductor chip;
Providing an electronic semiconductor chip configured for driving the pixelated light-emitting semiconductor chip,
Providing a carrier; and
Arranging the pixelated light-emitting semiconductor chip and the electronic semiconductor chip next to one another on the carrier.

9. A lighting device, comprising:
a pixelated light-emitting semiconductor chip;
an electronic semiconductor chip for driving the pixelated light-emitting semiconductor chip; and
a carrier,
wherein the pixelated light-emitting semiconductor chip and the electronic semiconductor chip are arranged next to one another on the carrier,
wherein the pixelated light-emitting semiconductor chip comprises light-emitting pixels, the light-emitting pixels being arranged next to one another in a matrixlike fashion in the form of rows and columns,
wherein the electronic semiconductor chip comprises driver cells for driving light-emitting pixels of the pixelated light-emitting semiconductor chip, the driver cells being arranged next to one another in a matrixlike fashion in the form of rows and columns, and
wherein, as seen in plan view of the matrixlike arranged light-emitting pixels and matrixlike arranged driver cells, different shapes of light-emitting pixels of the pixelated light-emitting semiconductor chip and driver cells of the electronic semiconductor chip differ from one another in terms of shapes.

10. The lighting device according to claim 9,
wherein, as seen in plan view of the matrixlike arranged light-emitting pixels and matrixlike arranged driver cells, light-emitting pixels of the pixelated light-emitting semiconductor chip and driver cells of the electronic semiconductor chip differ from one another in terms of contours.

11. The lighting device according to claim 9,
wherein, as seen in plan view of the matrixlike arranged light-emitting pixels and matrixlike arranged driver cells, the driver cells of the electronic semiconductor chip comprise a rectangular shape and the light-emitting pixels of the pixelated light-emitting semiconductor chip comprise a shape deviating from the shape of the driver cells.

12. The lighting device according to claim 9, wherein, as seen in plan view of the matrixlike arranged light-emitting pixels and matrixlike arranged driver cells, the driver cells of the electronic semiconductor chip comprise a uniform shape and the light-emitting semiconductor chip comprises light-emitting pixels having different pixel shapes.

13. A lighting device, comprising:
a pixelated light-emitting semiconductor chip;
an electronic semiconductor chip for driving the pixelated light-emitting semiconductor chip; and
a carrier,
wherein the pixelated light-emitting semiconductor chip and the electronic semiconductor chip are arranged next to one another on the carrier,
the carrier comprises electrical conductor structures, by way of which the pixelated light-emitting semiconductor chip and the electronic semiconductor chip are electrically connected to one another,
the pixelated light-emitting semiconductor chip comprises light-emitting pixels, the electronic semiconductor chip comprises a semiconductor body in which driver cells are formed, the driver cells being configured for driving light-emitting pixels of the pixelated light-emitting semiconductor chip, and
driver cells of the electronic semiconductor chip are connected in parallel by way of electrical conductor structures of the carrier.

14. The lighting device according to claim 13,
wherein, on account of the parallel connection, a plurality of driver cells of the electronic semiconductor chip can drive a light-emitting pixel of the pixelated light-emitting semiconductor chip.

15. The lighting device according to claim 13,
wherein, on account of the parallel connection, a plurality of driver cells of the electronic semiconductor chip can simultaneously drive a light-emitting pixel of the pixelated light-emitting semiconductor chip.

16. The lighting device according to claim 13,
wherein, on account of the parallel connection, a plurality of driver cells of the electronic semiconductor chip can drive a light-emitting pixel of the pixelated light-emitting semiconductor chip in such a way that an electric current applied to the driven light-emitting pixel is increased.

17. The lighting device according to claim 13,
wherein the number of driver cells of the electronic semiconductor chip exceeds the number of light-emitting pixels of the light-emitting semiconductor chip.

* * * * *